(12) United States Patent
Sugihara et al.

(10) Patent No.: US 10,293,439 B2
(45) Date of Patent: *May 21, 2019

(54) SOLDERING APPARATUS AND FLUX-APPLYING DEVICE

(71) Applicant: Senju Metal Industry Co., Ltd., Tokyo (JP)

(72) Inventors: Takashi Sugihara, Tokyo (JP); Hiroshi Taguchi, Tokyo (JP); Tsutomu Hiyama, Tokyo (JP)

(73) Assignee: Senju Metal Industry Co., Ltd., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/576,293

(22) PCT Filed: Feb. 17, 2016

(86) PCT No.: PCT/JP2016/054595
§ 371 (c)(1),
(2) Date: Nov. 22, 2017

(87) PCT Pub. No.: WO2016/189902
PCT Pub. Date: Dec. 1, 2016

(65) Prior Publication Data
US 2018/0141168 A1    May 24, 2018

(30) Foreign Application Priority Data
May 25, 2015 (JP) ................. 2015-105390

(51) Int. Cl.
*B23K 1/08* (2006.01)
*B23K 1/20* (2006.01)
(Continued)

(52) U.S. Cl.
CPC ............ *B23K 37/0408* (2013.01); *B23K 1/00* (2013.01); *B23K 1/008* (2013.01); *B23K 3/00* (2013.01); *H05K 3/34* (2013.01)

(58) Field of Classification Search
CPC ............ B23K 1/00–1/206; B23K 1/08; B23K 3/00–3/087; B23K 37/04–37/0538; H05K 3/34; B23Q 1/265; F16H 25/24
See application file for complete search history.

(56) References Cited

FOREIGN PATENT DOCUMENTS

| JP | 4891379 U | 11/1973 |
| JP | 55147517 U | 10/1980 |

(Continued)

OTHER PUBLICATIONS

English translation of JP 2008-291924 to Kobayashi, published Dec. 4, 2007.*

(Continued)

*Primary Examiner* — Michael A Laflame, Jr.
(74) *Attorney, Agent, or Firm* — The Webb Law Firm

(57) ABSTRACT

A soldering apparatus including a flux-applying device having a nut that is fitted into the soldering apparatus and the flux-applying device can change a fixed position of the nut easier than that of a convention example even if any adhered matters generated when each apparatus or device is used for a long time are adhered. The nut screws on to the screw shaft having a predetermined length. The nut is provided with at least one non-meshing part that does not mesh with the screw shaft and is formed parallel to a movement direction thereof. The non-meshing part extends from a forward end of the nut to a rear end thereof along whole length of the nut.

6 Claims, 4 Drawing Sheets

(51) Int. Cl.
*B23K 3/00* (2006.01)
*B23K 37/04* (2006.01)
*B23K 1/00* (2006.01)
*B23K 1/008* (2006.01)
*H05K 3/34* (2006.01)

(56) References Cited

FOREIGN PATENT DOCUMENTS

| | | |
|---|---|---|
| JP | 6173818 U | 5/1986 |
| JP | 61146611 U | 9/1986 |
| JP | 6280009 U | 5/1987 |
| JP | 6327712 U | 2/1988 |
| JP | 6464747 A | 3/1989 |
| JP | 653644 A | 2/1994 |
| JP | 6198428 A | 7/1994 |
| JP | 1162938 A | 3/1999 |
| JP | 2000145915 A | 5/2000 |
| JP | 200127215 A | 1/2001 |
| JP | 200144619 A | 2/2001 |
| JP | 200165663 A | 3/2001 |
| JP | 2002240920 A | 8/2002 |
| JP | 2008291924 A | 12/2008 |
| WO | 2015052763 A1 | 4/2015 |

OTHER PUBLICATIONS

English translation of JP 2001-065663 to Takahashi, published Aug. 27, 1999.*

* cited by examiner

SOLDERING APPARATUS AND FLUX-APPLYING DEVICE

CROSS-REFERENCE TO RELATED APPLICATIONS

This application is the United States national phase of International Application No. PCT/JP2016/054595 filed Feb. 17, 2016, and claims priority to Japanese Patent Application No. 2015-105390 filed May 25, 2015, the disclosures of which are hereby incorporated in their entirety by reference.

TECHNICAL FIELD

The present invention relates to a soldering apparatus and a flux-applying device, which use a nut that is applicable to the soldering apparatus, the flux-applying device for applying the flux or the like, in connection with mounting of electronic components on a printed circuit board. It specifically relates to the soldering apparatus and the flux-applying device, which use a nut that does not hinder the screw shaft from revolving even when a part of the flux evaporated by the soldering or the flux-applying or the flux is adhered and fixed to the screw shaft or the like.

BACKGROUND TECHNOLOGY

A soldering apparatus for soldering electronic components on a printed circuit board or a flux-applying device for applying flux on the printed circuit board is provided with rails for conveying the printed circuit board, which is adjustable to a width of the printed circuit board (see patent documents 1 and 2). A supporting member for supporting the conveying printed circuit board from below so that it is not flexible by its weight, in which a fixed position thereof to the screw shaft is changeable for a size of the printed circuit board, is known.

For example, in the soldering of the reflow device, the printed circuit board on which the solder paste has been previously printed is conveyed into the reflow device and heated therein. The solder paste contains powder solder and the flux. The flux is made by dissolving a solid component such as rosin, thixotropic agent and activator with solvent.

In the above-mentioned heating step, the flux evaporates and an interior of the reflow device is filled with it. More in detail, in a preliminary heating zone, the solvent in the flux components particularly evaporates to become flux fumes. The solid components such as rosin in the flux components also evaporate to become fumes and waft in the device when it is exposed to high temperature within a heating zone.

For example, when a part of the evaporated flux fumes is adhered to a surface of a member (screw shaft, nut or the like) for adjusting conveying rails for conveying the printed circuit board to be a width between the rails matching a size of the board and to a surface of a member (screw shaft, nut or the like) for adjusting the fixed position to support the board, it becomes liquid flux fumes with flowability accompanied by reduced temperature. The liquid flux fumes are soon solidified. Since the solidified flux fumes are hard to be removed and are strongly adhered, it is not easily possible to remove them by revolving the screw shaft. Accordingly, a movement of the nut is difficult so that it is very difficult to adjust the fixed position thereof to the screw shaft.

Further, in a jet soldering apparatus which jets molten solder to perform the soldering, there is a case where the solder scattered by the scatter of the molten solder is adhered hard into a ball to the member (screw shaft, nut or the like) for adjusting conveying rails for conveying the printed circuit board to be a width between the rails matching a size of the board. In this case, like the above-mentioned case, it is not also easily possible to remove them by revolving the screw shaft. Accordingly, a movement of the nut is difficult so that it is very difficult to adjust the fixed position thereof to the screw shaft.

In the flux-applying device, dripped flux is also adhered to the screw shaft and solidified so that the fixed flux is hard to be easily stripped by the revolution of the screw shaft. Accordingly, any similar problems occur such that the fixed position of the nut to the screw shaft cannot be changed by its movements.

On the other hand, any screw or nut, a part of a screw thread of which is cut by a predetermined length, has been disclosed as the nut having a function of removing the film adhered to the screw or nut (see Patent Documents 3 through 5).

DOCUMENTS FOR PRIOR ART

Patent Documents

Patent Document 1: Japanese Patent Application Publication No. 2001-44619
Patent Document 2: Japanese Patent Application Publication No. H06-53644
Patent Document 3: Japanese Patent Application Publication No. H11-62938
Patent Document 4: Japanese Patent Application Publication No. 2001-27215
Patent Document 5: Japanese Utility Model Application Publication No. S62-80009

SUMMARY OF THE INVENTION

Problems to be Solved by the Invention

However, the apparatuses disclosed in the above-mentioned Patent Documents 1 and 2 have taken no measure to the above problems. The nut or screw disclosed in the above-mentioned Patent Documents 3 through 5 have only an object to move on a direction, in order to loosen the screw, when the film or the like is adhered and solidified. They have not expected that it is provided in an apparatus for manipulating the movement of the nut to change the fixed position of the nut to the screw shaft. They also have taken no measure to the above problems.

Thus, the present invention solves such problems and has an object to remove any flux fumes which are attached and solidified to members (screw shaft and nut) for allowing their fixed positions to be changed to match a size of a substrate in the soldering apparatus or the flux-applying device. In addition, when any adhered matters are fixed to the screw shaft, it also similarly has an object to remove any adhered matters fixed to the nut and/or the screw shaft.

Means for Solving the Problems

The technical means of this invention taken for solving the above-mentioned problems is as follows.

(1) A soldering apparatus comprising an adjusting member for a substrate flexible prevention mechanism, the adjusting member being changed to match a width of a substrate to be conveyed and including a screw shaft which revolves, a nut having a flange portion for connection, a fixed position of the nut with regards to the screw shaft being movable by a revolution of the screw shaft, and a substrate-supporting portion for supporting the substrate and preventing the flexibility of the substrate, the substrate-supporting portion being fixed to the nut through the flange portion for connection, wherein the nut contains a screw portion from a forward end to a rear end and includes at least one non-meshing part that does not meshing with the screw shaft along whole length of the nut, and wherein when the screw shaft revolves to change the fixed position of the substrate-supporting portion, adhered matter adhered and solidified to the screw shaft is removed by an edge of the non-meshing part accompanied by the revolution of the screw shaft.

(2) The soldering apparatus according to the above item (1) is such that the non-meshing part includes exhaust ports at the forward end and the rear end of the nut, and a larger amount of the removed adhered matter is exhausted from the exhaust port of an adhered matter removed side.

(3) The soldering apparatus according to the above item (1) is such that when the fixed position of the nut with regards to the screw shaft is changed, the adhered matter is removed without changing upper and lower positions of the non-meshing part.

(4) A flux applying device comprising an adjusting member, the adjusting member being changed to match a width of a substrate to be conveyed and including a screw shaft which revolves, a nut having a flange portion for connection, a fixed position of the nut with regards to the screw shaft being movable by a revolution of the screw shaft, and a supporting portion for supporting rails for conveying the substrate, the supporting portion allowing a width between the rails to be changed to match a width of the substrate and being fixed to the nut through the flange portion for connection, wherein the nut contains a screw portion from a forward end to a rear end and includes at least one non-meshing part that does not mesh with the screw shaft along whole length of the nut, and wherein when the screw shaft revolves to change a fixed position of a substrate-supporting portion, adhered matter adhered and solidified to the screw shaft is removed by an edge of the non-meshing part accompanied by the revolution of the screw shaft.

(5) The flux-applying device according to the above item (4) is such that the non-meshing part includes exhaust ports at the forward end and the rear end of the nut, and a larger amount of the removed adhered matter is exhausted from the exhaust port of an adhered matter removed side.

(6) The flux-applying device according to the above item (4) is such that when the fixed position of the nut with regards to the screw shaft is changed, the adhered matter is removed without changing upper and lower positions of the non-meshing part.

Effects of the Invention

By the nut used for this invention, it is possible to strip the adhered matter by a function of the non-meshing part even when the adhered matter is fixed to the screw shaft which the nut meshes. Since the non-meshing part strips off or scraps the adhered matter without fixing the adhered matter stripped by the nut to another screw shaft (valley of screw) again, it stops the prevention of the revolution of the screw shaft by the stripped adhered matter (scrapped matter), so that the screw shaft smoothly rotates. As a result thereof, it is possible to change (adjust) a fixed position of the nut easier that the conventional case.

By the soldering apparatus and the flux-applying device according to the invention, since any flux fumes which are adhered and solidified to the members (screw shaft and nut) for changing the fixed position thereof to match the width of the substrate in the apparatus and device are removed while they are scrapped, a forward or backward movement of the nut to the screw shaft becomes easy so that it is easily possible to change the fixed position of the nut. Accordingly, it is easily possible to remove the flux adhered to the screw shaft and to adjust the fixed position of the rails for conveying the substrate, the substrate-supporting portion or the like to match a size of the substrate. Since it is easily possible to remove the adhered flux, it is possible to reduce time and costs required for maintenance of the apparatus or device. Further, since the soldering apparatus and the flux-applying device according to the invention have such a configuration that the fixed position of the nut is changeable by revolving the screw shaft, upper and lower positions of the non-meshing part do not alter even when changing the foxed position of the nut. Accordingly, the removed adhered matter can be caught by the revolution of the screw shaft again and exhausted to outside of the nut without preventing the forward or backward movement of the nut.

DESCRIPTION OF THE INVENTION

The following will describe a soldering apparatus and a flux-applying device as embodiments according to the invention with reference to the drawings.

First Embodiment

A configuration example of a soldering apparatus 1 as the first embodiment according to the invention will be described with reference to FIGS. 1 through 3.

Figure 1:
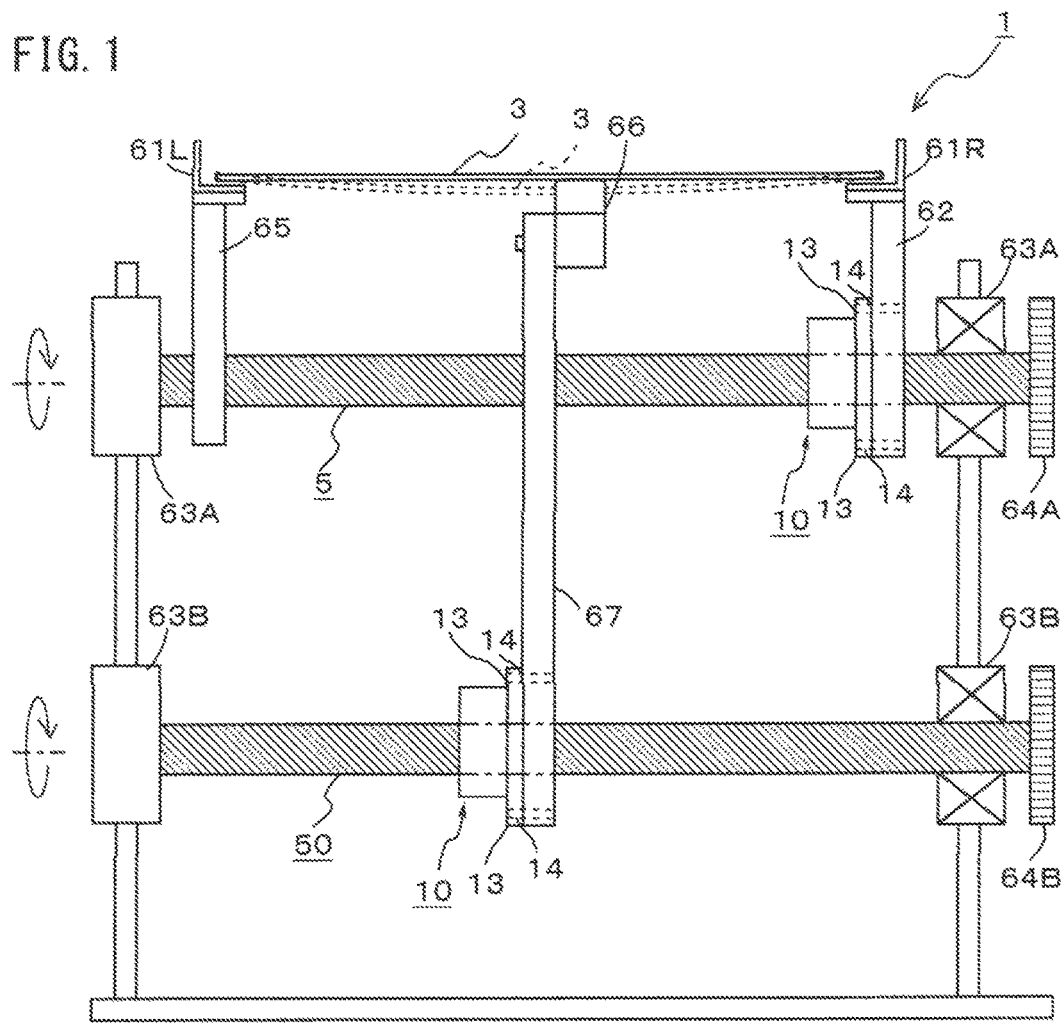
FIG. 1 is an outlined plan view of a soldering apparatus 1 for showing a configuration example as a first embodiment according to the invention.

As shown in FIG. 1, the soldering apparatus 1 is a device for soldering by heating and processing, for example, the printed circuit board 3 or the like in which solder paste is applied to predetermined electrodes. The soldering apparatus 1 is provided with a pair of conveying rails 61L, 61R, a substrate-supporting portion 66 for supporting the printed circuit board 3 from below along a vertical direction to match a width of the printed circuit board 3, and an adjusting member being changed to match the width of the printed circuit board 3. As this adjusting member, screw shafts 5, 50 and nuts 10 that are respectively configured to be able to change their fixed positions with regards to the screw shafts 5, 50 are provided.

The conveying rail 61L is set to be a fixed rail and the conveying rail 61R is set to be a movable rail. As the adjusting member for changing a fixed position of the conveying rail 61R, the soldering apparatus 1 is provided with the following members. The conveying rail 61R is supported by a rail-supporting portion 62. The rail-supporting portion 62 is connected with the nut 10 through connection holes 14 thereof by the screws or the like. The nut 10 screws on to the screw shaft 5. The screw shaft 5 is rotatably supported at opposite ends by a pair of bearings 63A and is revolved by a rotation member 64A. Through the forward or backward revolution of the screw shaft 5, the nut 10 meshed therewith moves forward or backward along the screw shaft 5. Thus, the conveying rail 61R moves forward or backward along the screw shaft 5. The conveying rail 61L is supported by a rail-supporting portion 65 but since the rail-supporting portion 65 is configured not to mesh with the screw shaft 5 (which is not shown), the conveying rail 61L is fixed, not moved, at this position even when the screw shaft 5 revolves.

As described above, when the rotation member 64A rotates, the nut 10 moves forward or backward, so that a screwed position of the screw shaft 5 and the nut 10 alters, thereby allowing a fixed position of the nut 10 to the screw shaft 5 to alter. Thus, it is possible to change a width between the pair of the conveying rails 61L, 61R to match the width of the printed circuit board 3.

When the printed circuit board 3 has a large size, as shown in the dotted lines in the drawing, the printed circuit board 3 is bent (flexible) by its weight during the conveying time. As a flexible prevention mechanism of this printed circuit board 3, the soldering apparatus 1 is provided with the substrate-supporting portion 66. As the adjusting member for changing a fixed position of the substrate-supporting portion 66 to the screw shaft 50, the soldering apparatus 1 is provided with the following members. The substrate-supporting portion 66 is supported by a supporting portion 67. The supporting portion 67 is connected with the nut 10 through connection holes 14 thereof by the screws or the like. The nut 10 screws on to the screw shaft 50. The screw shaft 50 is rotatably supported at opposite ends by a pair of bearings 63B and is revolved by a rotation member 64B. Through the forward or backward revolution of the screw shaft 50, the nut 10 meshed therewith moves forward or backward along the screw shaft 50. Thus, the substrate-supporting portion 66 moves forward or backward along the screw shaft 50.

As described above, when the rotation member 64B rotates, the nut 10 moves forward or backward, so that a screwed position of the screw shaft 50 and the nut 10 alters, thereby allowing a fixed position of the nut 10 to the screw shaft 50 to alter. Thus, it is possible to change a fixed position of the substrate-supporting portion 66 to match the width of the printed circuit board 3.

Figure 2A:
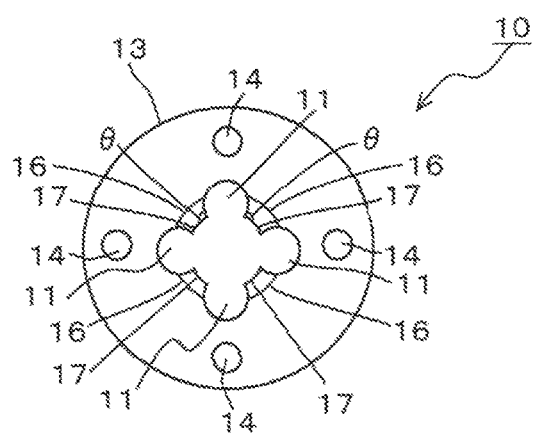
FIG. 2a is a plan view of a nut 10 for showing a configuration example thereof.
Figure 2B:
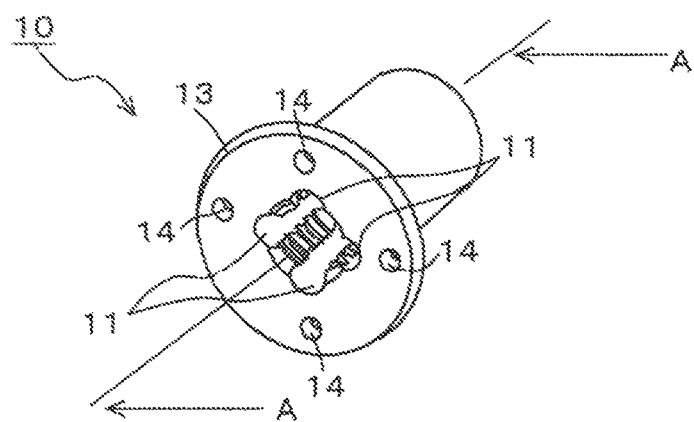
FIG. 2B is a perspective view of the nut 10 for showing the configuration example thereof.

The nut 10 shown in FIGS. 2A and 2B screws on to the screw shaft 5, 50 having a predetermined length (see FIG. 1) and is able to change the fixed position of the nut 10 to the screw shaft 5, 50. In FIG. 2A, a narrow line circle indicates a valley 16 of screw in the nut 10. A bold line circle indicates a screw thread 17 of the nut 10.

The nut 10 shown in FIG. 2B includes four non-meshing parts 11 in this embodiment, each of which does not mesh with the screw shaft 5, 50. The nut 10 also includes a flange portion 13 for connecting another member at one end thereof. Each of the non-meshing parts 11 is formed by cutting off a part of the screw thread of the nut 10 in an arc-like shape to outside. The flange portion 13 contains four connecting holes 14 in this embodiment for allowing it to be connected to another member by screws or the like.

When the four non-meshing parts 11 are provided like this embodiment, it is preferable to keep angle interval there about 90 degrees. Any of the four non-meshing parts 11 are able to efficiently strip any adhered matters, which will be described later, even if they are more firmly adhered.

A shape of each of the non-meshing parts 11 is not limited to an arc-like shape. A diameter (width) of each of the non-meshing parts 11 is not limited but it is preferable that a cut depth of each of the non-meshing parts 11 is deeper than the valley of screw in the nut 10. An angle $\theta$ formed by the screw thread 17 and the non-meshing part 11 (see FIG. 2A) is not limited but 90 degrees or less is preferable. If so, it is possible to efficiently strip any adhered matters, which will be described later, by any of the non-meshing parts 11 even when they are more firmly adhered.

Figure 3:
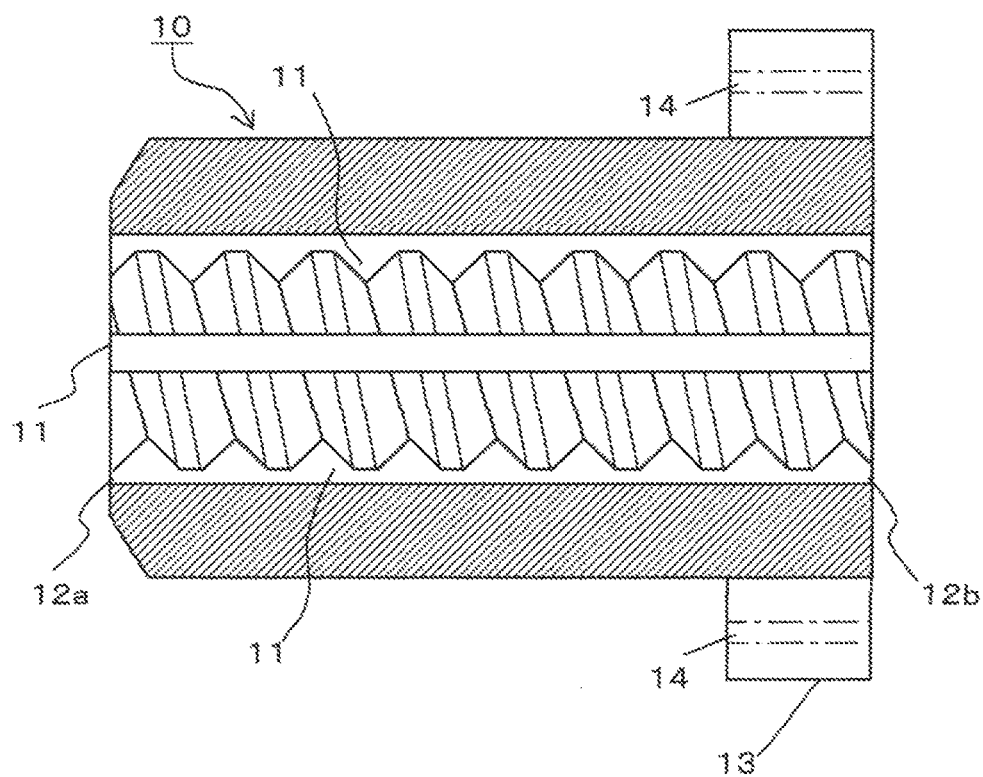
FIG. 3 is a cross-sectional view of the nut 10, taken along lines A-A of FIG. 2B, for showing the configuration example thereof.

The non-meshing parts 11 shown in FIG. 3 are arranged parallel to a movement direction of the nut 10 with regards to the screw shaft 5, 50, not shown in this drawing, at a whole length (whole) from a forward end of the nut 10 to a rear end thereof. A first exhaust port 12a is formed at an opening at one end side of the nut 10 and a second exhaust port 12b is formed at an opening at the other end side of the nut 10.

Although the four non-meshing parts 11 have been arranged in the not 10, a number of the non-meshing parts is not limited thereto. At least one non-meshing part may be provided. For example, when two non-meshing parts 11 are arranged, it is preferable that a pair of the non-meshing parts 11 is symmetrically arranged on a radial direction of the nut 10. When three non-meshing parts 11 are arranged, it is preferable to maintain angular interval of almost 120 degrees. Since a contact area between the screw shaft 5, 50 and the nut 10 becomes smaller when plural non-meshing parts 11 are arranged, it is possible to efficiently strip any adhered matters even when they are more firmly adhered to a portion between the screw shaft 5, 50 and the nut 10.

Materials

The nut 10 is made of metals such as brass or the like but may be made of stainless steel. When it is made of the stainless steel, it is very preferable that after processing, any nitriding is performed on a surface thereof by known means so that the surface becomes rigid and smooth. The same goes for the material of the nut, too, in the following. Although the nut 10 and the screw shaft 5, 50 are trapezoidal screws in this embodiment, the invention is not limited thereto. For example, a ball screw or a triangle screw may be used.

Manufacturing Method

After the nut 10 has been provided with the screw threads by an already known method, the non-meshing parts 11 are processed and formed in the nut 10 by an endmill or the like. After the hole has been pierced in the nut 10, burrs are removed. Each of the non-meshing parts 11 is formed so as to cut off the screw threads in the nut 10. Each of the non-meshing parts 11 is formed parallel to a movement direction of the nut 10 to the screw shaft 5, 50 at a whole length (whole) from a forward end of the nut 10 to a rear end thereof.

Figure 4A:
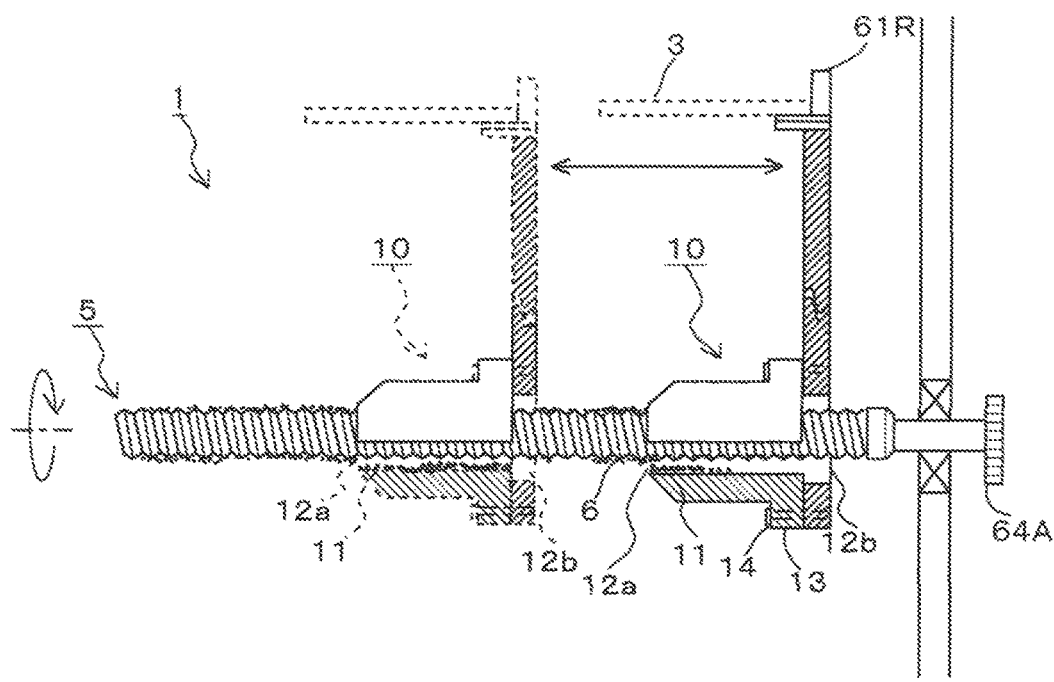
FIG. 4A is a partially cross-sectional view of the soldering apparatus 1 for showing an adjustment example when the nut 10 is fitted to the soldering apparatus 1.
Figure 4B:
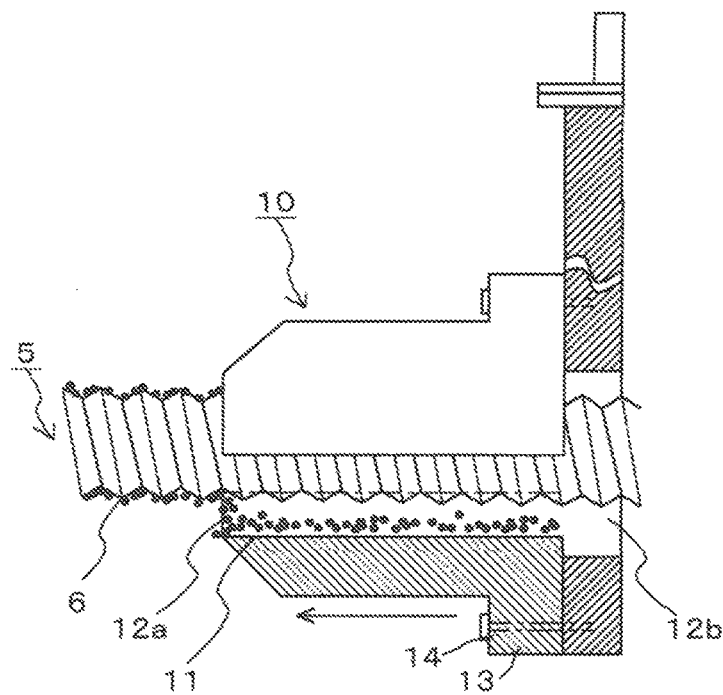
FIG. 4B is an enlarged cross-sectional view of the soldering apparatus 1 for showing an adjustment example when the nut 10 is attached to the soldering apparatus 1.

Next, the following will describe an adjustment example of the fixed position of the nut 10 attached to the soldering apparatus 1 with reference to FIGS. 1, 4A and 4B. In FIGS. 4A and 4B, only one part of the non-meshing parts 11 is shown for examination.

As shown in FIG. 1, the conveying rail 61L is set to be a fixed rail, a position along a width direction of which is fixed, and the conveying rail 61R and the substrate-supporting portion 66 are set to be a movable rail. As described above, the screw shafts 5, 50 and the nuts 10 change the fixed positions of the conveying rail 61R and the substrate-supporting portion 66. When the rotation member 64A, 64B rotates, the nut 10 moves forward or backward. For example, when the printed circuit board 3 has a large width, the conveying rail 61R and the substrate-supporting portion 66 move away from the conveying rail 61L (to a right side in the drawing) in a case of rotating any of the rotation members 64A, 64B clockwise viewed from the right side of the drawing, so that the nuts 10 are moved. When the printed circuit board 3 has a small width, the conveying rail 61R and the substrate-supporting portion 66 come close to the conveying rail 61L (to a left side in the drawing) in a case of rotating any of the rotation members 64A, 64B counterclockwise viewed from the right side of the drawing, so that the nuts 10 are moved.

The alteration of the screwed position of the screw shaft 5 and the nut 10 allows the fixed position of the nut 10 to the screw shaft 5 to alter. Accordingly, it is possible to change a width between a pair of the conveying rails 61L, 61R to match a size of the printed circuit board 3 and it is possible to change the fixed position of substrate-supporting portion 66 to match a size of the printed circuit board 3.

As shown in FIG. 4A, flux fumes and the like are adhered to any of screw threads and valleys of screw shaft 5 due to a usage of the soldering apparatus 1 for a long time. Such adhered matters are solidified in time so as to be fixed matters 6. When the nut 10 moves forward or backward, the fixed matters 6 are stripped and scrapped by mainly edges of the non-meshing parts 11 of the nut 10. The scrapped fixed matters 6 (scrapped filings) are collected into the non-meshing parts 11 and dropped from the first exhaust port 12a or the second exhaust port 12b. Since it is configured so that any of the first exhaust port 12a and the second exhaust port 12b can exhaust the scrapped filings, the fixed position of the nut 10 can be moved to both of left and right in the drawing following a size of the printed circuit board 3.

These scrapped filings are scraped from a side of the movement direction of the nut 10 for the most part. For example, when the nut 10 moves to the left side of the drawing, the scrapped filings are exhausted from the first exhausted port 12a for the most part. When the nut 10 further moves to the left side of the drawing, the scrapped filings are accumulated in the non-meshing parts 11 and are also exhausted from the second exhausted port 12b. On the other hand, when the nut 10 moves to the right side of the drawing, the scrapped filings are exhausted from the second exhausted port 12b for the most part. When the nut 10 further moves to the right side of the drawing, the scrapped filings are accumulated in the non-meshing parts 11 and are also exhausted from the first exhausted port 12a. This prevents the stripped scraped filings from being again adhered to the nut 10 and/or the screw shaft 5 and prevents obstructing the forward or backward movement of the nut 10.

Thus, when rotating the screw shaft 5 so that the nut 10 moves on the screw shaft 5, the non-meshing parts 11 function as if they removes the fixed matters 6 with them being scrapped. As shown in FIG. 4B, the fixed matters 6 scraped by the non-meshing parts 11 are accumulated in the non-meshing parts 11 and dropped from the first exhaust port 12a or the second exhaust port 12b. Thus, it is relatively easily possible to change the fixed position of the nut 10 to the screw shaft 5. The movement of the substrate-supporting portion 66 shown in FIG. 1 is also similar to the movement of the conveying rail 61R. The movement thereof is not illustrated but is such that when the screw shat 50 revolves, the nut 10 scrapes the fixed matters 6 adhered to the screw shaft 50 and the nut 10 moves forward or backward with the removed fixed matters 6 being dropped out of the first exhaust port 12a or the second exhaust port 12b, so that the fixed position thereof can be easily changed.

According to the nut 10, the non-meshing parts 11 function as if they scrap the fixed matters 6 to remove them merely by revolving the screw shaft so that the nut 10 move on the screw shaft 5, 50 even if there are the fixed matters 6 in the screw shaft 5, 50 when the soldering apparatus 1 is used for a long time. Therefore, it is possible to easily remove the flux fumes which have been adhered to the screw shafts 5, 50 and/or the nuts 10 and solidified thereon, thereby enabling the fixed positions of the nuts 10 to be easily changed.

Therefore, it is possible to easily remove the fixed matters 6 which have been adhered to the screw shafts 5, 50 and/or the nuts 10 and to easily adjust the fixed position of the conveying rail 61R or the substrate-supporting portion 66 to match the width of the printed circuit board 3 to be conveyed. Since it is possible to easily remove the adhered fixed matters 6, it is possible to reduce times and costs required for the maintenance of the apparatus.

Since it is configured such that the nut has the non-meshing parts 11 but does not rotate and the fixed position of the nut 10 to the screw shaft 5, 50 is changeable by the revolution of the screw shaft 5, 50, upper and lower positions of the non-meshing parts 11 remain unchanged when changing the fixed position of the nut 10. Therefore, the removed fixed matters 6 are exhausted from the nut 10 to outside without being involved in the revolution of the screw shaft 5, 50 and obstructing the forward or backward movement of the nut 10.

Second Embodiment

Figure 5:
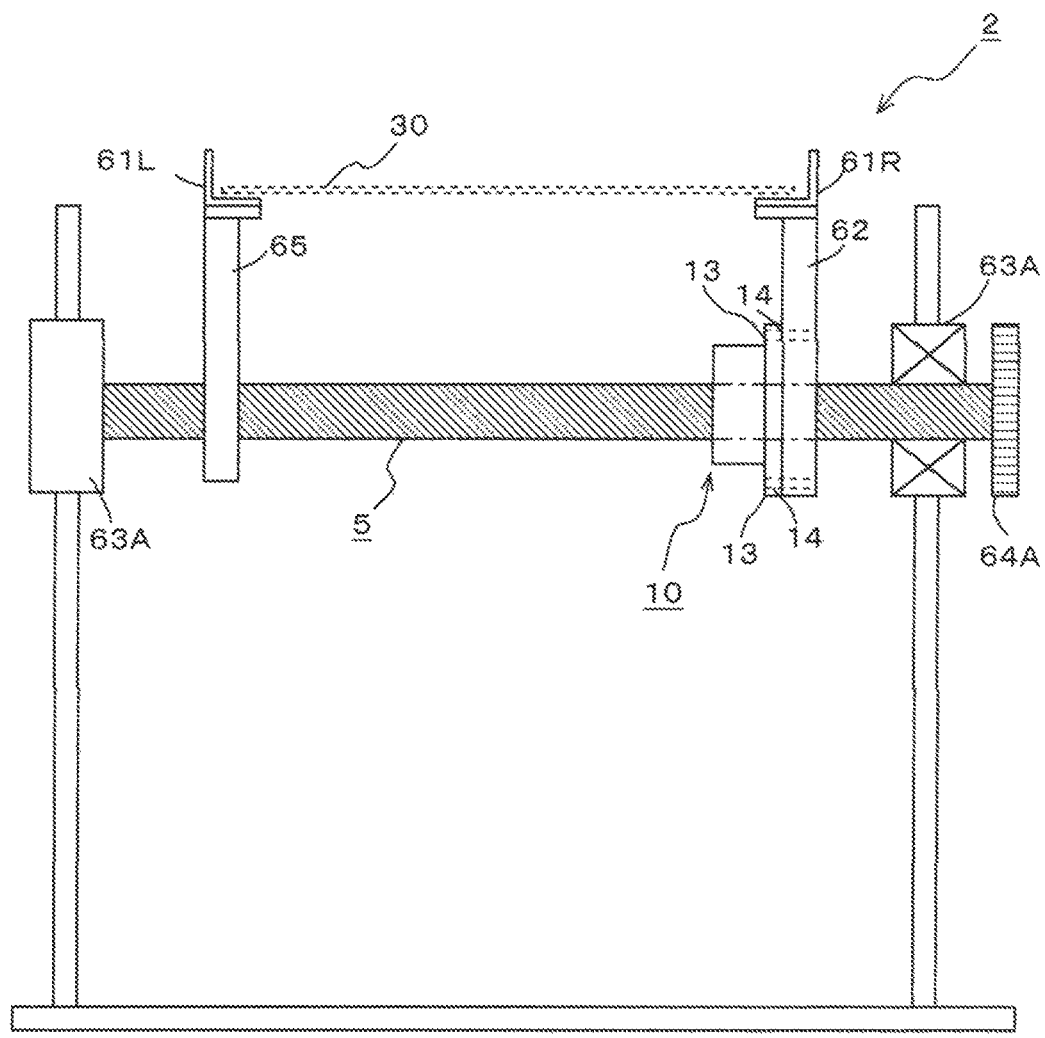
FIG. 5 is an outline plan view of a flux-applying device 2 for showing a configuration example thereof as a second embodiment according to the invention.

The following will describe a configuration example of the flux applying device 2 as a second embodiment with reference to FIG. 5. Like codes are applied to like members of the first embodiment, the detailed explanation of which will be omitted.

The flux applying device 2 according to the invention is provided with a pair of conveying rails 61L, 61R, and an adjusting member which is changed to match the width of the printed circuit board 30. As this adjusting member, a screw shaft 5 having a predetermined length and a nut 10 that screws on to the screw shaft 5 and is configured to be able to change its fixed position to match the screw shaft 5 are provided.

The conveying rail 61L is set to be a fixed rail and the conveying rail 61R is set to be a movable rail. As the adjusting member for changing a fixed position of the conveying rail 61R, the flux-applying device 2 is provided with the following members. The conveying rail 61R is supported by a rail-supporting portion 62. The rail-supporting portion 62 is connected with the nut 10 through connection holes 14 of the flange portion 13 thereof by the screws or the like. The nut 10 screws on to the screw shaft 5. The screw shaft 5 is rotatably supported at opposite ends by a pair of bearings 63A and is revolved by a rotation member 64A. Through the revolution of the screw shaft 5, the nut 10 meshed therewith moves forward or backward along the screw shaft 5. Thus, the conveying rail 61R moves forward or backward along the screw shaft 5. The conveying rail 61L is supported by a rail-supporting portion 65 but since the rail-supporting portion 65 is configured not to mesh with the screw shaft 5 (which is not shown), the conveying rail 61L is fixed, not moved, at this position even when the screw shaft 5 revolves.

As described above, when the rotation member 64A rotates, the nut 10 moves forward or backward, so that a screwed position of the screw shaft 5 and the nut 10 alters, thereby allowing a fixed position of the nut 10 to the screw shaft 5 to alter. Thus, it is possible to change a width between the pair of the conveying rails 61L, 61R to match the size of the printed circuit board 3.

The nut 10 performs the same movements as those of the nut 10 of the first embodiment shown in FIGS. 4A and 4B. In this moment, even when the flux fumes or the like is fixed to the screw shaft 5, the non-meshing parts 11, not shown, function as if they remove the fixed matters 6 to exhaust them from the first exhaust port 12a or the second exhaust port 12b by merely rotating the rotation member 64A so that the nut 10 moves on the screw shaft 5. Thus, it is possible to easily remove the flux fumes which have been adhered to the screw shaft 5 and/or the nut 10 and solidified thereon, thereby enabling the fixed positions of the nut 10 to be easily changed. Accordingly, it is possible to reduce times and costs required for the maintenance of the flux-applying device 2.

INDUSTRIAL APPLICABILITY

This invention is applicable to a case where the adhered matters are adhered to the screw shaft because it is possible to strip the adhered matters by action of the non-meshing parts even if the adhered matters are fixed to the screw shaft. For example, it is very preferable that the invention is applied to a soldering apparatus or a flux-applying device to which flux fumes are fixed or a coating material coating device to which a coating material is fixed.

EXPLANATION OF CODES

1: Soldering Apparatus
2: Flux-applying Device
5, 50: Screw Shaft
10: Nut
11: Non-meshing Parts
12a: First Exhaust Port
12b: Second Exhaust Port
13A: Flange Portion
14A: Connection Hole(s)
61L, 61R: Conveying Rail
62, 65: Rail-Supporting Portion
63A, 63B: Bearing
64A, 64B: Rotation Member
66: Substrate-Supporting Portion
67: Supporting Portion

The invention claimed is:

1. A soldering apparatus comprising an adjusting member for a substrate flexible prevention mechanism, the adjusting member being changed to match a width of a substrate to be conveyed and including:
a screw shaft which revolves;
a nut having a flange portion for connection, a fixed position of the nut with regards to the screw shaft being movable forward or backward by a revolution of the screw shaft; and
a substrate-supporting portion for supporting the substrate and preventing the flexibility of the substrate, the substrate-supporting portion being fixed to the nut through the flange portion for connection,
wherein the nut contains an interior bore extending through a whole length of the nut, a screw portion within the interior bore extending from a forward end to a rear end of the nut, and at least one non-meshing part within the interior bore extending from the forward end to the rear end of the nut that does not mesh with the screw shaft, and
wherein when the screw shaft revolves to change the fixed position of the substrate-supporting portion, adhered matter adhered and solidified to the screw shaft is removed by an edge of the non-meshing part accompanied by the revolution of the screw shaft.

2. The soldering apparatus according to claim 1 wherein the non-meshing part includes exhaust ports at the forward end and the rear end of the nut, and a larger amount of the removed adhered matter is exhausted from the exhaust port of an adhered matter removed side.

3. The soldering apparatus according to claim 1 wherein when the fixed position of the nut with regards to the screw shaft is changed, the adhered matter is removed without changing upper and lower positions of the non-meshing part.

4. A flux-applying device comprising an adjusting member, the adjusting member being changed to match a width of a substrate to be conveyed and including:
a screw shaft which revolves;
a nut having a flange portion for connection, a fixed position of the nut with regards to the screw shaft being movable forward or backward by a revolution of the screw shaft; and
a supporting portion for supporting rails for conveying the substrate, the supporting portion allowing a width between the rails to be changed to match a width of the substrate and being fixed to the nut through the flange portion for connection,
wherein the nut contains an interior bore extending through a whole length of the nut, a screw portion within the interior bore extending from a forward end to a rear end of the nut, and at least one non-meshing part within the interior bore extending from the forward end to the rear end of the nut that does not mesh with the screw shaft, and
wherein when the screw shaft revolves to change a fixed position of the rails for conveying the substrate, adhered matter adhered and solidified to the screw shaft is removed by an edge of the non-meshing part accompanied by the revolution of the screw shaft.

5. The flux-applying device according to claim 4 wherein the non-meshing part includes exhaust ports at the forward end and the rear end of the nut, and a larger amount of the removed adhered matter is exhausted from the exhaust port of an adhered matter removed side.

6. The flux-applying device according to claim 4 wherein when the fixed position of the nut with regards to the screw shaft is changed, the adhered matter is removed without changing upper and lower positions of the non-meshing part.

* * * * *